United States Patent
Vranish et al.

(10) Patent No.: US 6,734,602 B1
(45) Date of Patent: *May 11, 2004

(54) LINEAR MAGNETOSTRICTIVE ACTUATOR

(75) Inventors: John M. Vranish, Crofton, MD (US);
Joseph P. Teter, Mount Airy, MD (US)

(73) Assignee: The United States of America as represented by the Secretary of the Navy, Washington, DC (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 222 days.

(21) Appl. No.: 10/021,681

(22) Filed: Dec. 5, 2001

(51) Int. Cl.[7] .......................... H01L 41/22; H01L 41/08
(52) U.S. Cl. ........................................ 310/328; 310/326
(58) Field of Search .............................. 310/328, 26, 27; 318/118; 335/215; H01L 41/04, 41/08

(56) References Cited

U.S. PATENT DOCUMENTS

| | | | | |
|---|---|---|---|---|
| 4,017,754 A | * | 4/1977 | Jarrett et al. .................. | 310/26 |
| 5,039,894 A | * | 8/1991 | Teter et al. .................... | 310/26 |
| 5,184,037 A | * | 2/1993 | Kobayashi et al. ........... | 310/26 |
| 5,451,821 A | * | 9/1995 | Teter et al. .................... | 310/26 |
| 5,484,622 A | * | 1/1996 | Caden et al. ................. | 426/555 |
| 5,705,863 A | * | 1/1998 | Teter ............................. | 310/26 |
| 6,410,999 B1 | * | 6/2002 | Vranish et al. ............... | 310/328 |

* cited by examiner

Primary Examiner—Thomas M. Dougherty
Assistant Examiner—Karen Addison
(74) Attorney, Agent, or Firm—Jacob Shuster

(57) ABSTRACT

Linear output motion of a substantial distance is imparted to the top plate of an actuator by forces produced within layers respectively formed by interconnectors on which magnetostriction material slabs are positioned in engagement with end retainers of the interconnectors through which such forces are transferred in sequence to produce the output motion in response to applied magnetic fields, inducing maximized magnetostriction in a direction perpendicular to such output motion. The magnetic fields are generated by electric current conducted through wiring coils extending through the magnetostriction material slabs maintained assembled in the layers under a prestress arrangement accommodating relative displacements resulting from the output motion.

6 Claims, 5 Drawing Sheets

LINEAR MAGNETOSTRICTIVE ACTUATOR

BACKGROUND OF THE INVENTION

Magnetostrictive actuators are generally known in the art, wherein one end of the active element is fixed or grounded while the other end undergoes a limited stroke of mechanical motion. Heretofore, one standard type of such actuator also included a prestress mechanism to bias the active element made of Terfenol, Terzinol or some other magnetostriction material and a ferromagnetic casing providing a return path for magnetic field energy produced during energized operation of the actuator.

It is also known in the art, as reflected by the disclosure of a linear magnetostrictive motor in U.S. Pat. No. 5,039,894 to Teter et al., that greater magnetostriction occurs in a single crystal material element along its crystalline axis. Accordingly, the prestress and magnetic circuit applied was arranged to obtain output motion in a crystallographic direction of growth of the magnetostriction material along its crystalline axis, as the usual direction of usage associated with a relatively short stroke of 0.001 dl/l for example. It is therefore an important object of the present invention to provide a compact magnetostrictive type of linear motion actuator having a substantially longer output stroke so as to extend its usefulness in many applications.

SUMMARY OF THE INVENTION

In accordance with the present invention, a linear motion actuator includes a magnetic circuit assembly of layers through which a substantially longer output stroke is achieved in a direction perpendicular to the crystallographic direction of deformation imposed by magnetic fields applied to the magnetostriction material. According to one embodiment, slabs of said magnetostriction material are positioned on opposite sides of interconnectors respectively associated with the layers of the circuit assembly to which magnetic fields are applied by wiring coils to which electrical energy current is supplied. During each operational cycle, magnetostrictively produced deformation forces produced by the applied magnetic fields are transferred in sequence in a direction perpendicular to the crystalline axis of the magnetostriction slabs from a lowermost layer at the actuator ground end to the uppermost layer from which the output motion is obtained. Such layers of the magnetic circuit assembly are held assembled between a fixed ground and an uppermost output element of the actuator spaced therefrom along a bias axis under an adjustable prestress which accommodates lateral displacement of the output element relative to such bias axis.

BRIEF DESCRIPTION OF DRAWING

A more complete appreciation of the invention and many of its attendant advantages will be readily appreciated as the same becomes better understood by reference to the following detailed description when considered in connection with the accompanying drawing wherein.

DETAILED DESCRIPTION OF PREFERRED EMBODIMENT

Figure 1:
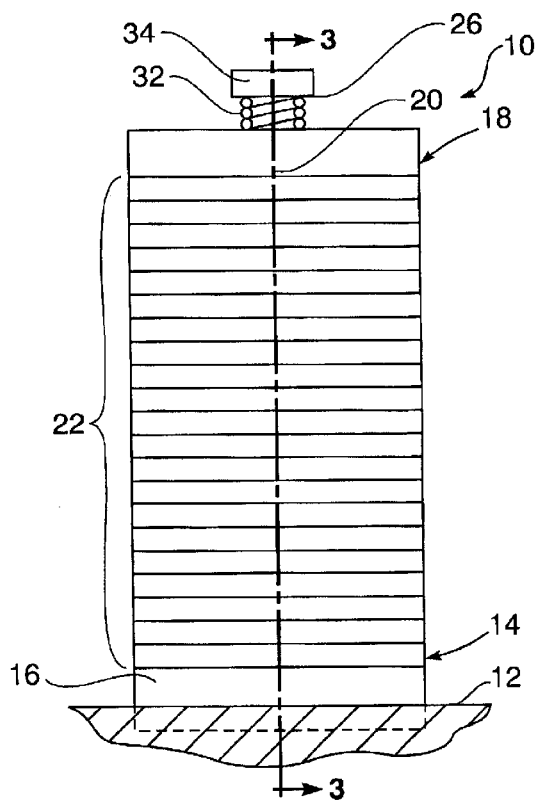
FIG. 1 is a rear end elevation view of an actuator fixed to a ground support surface, in accordance with one embodiment.
Figure 2:
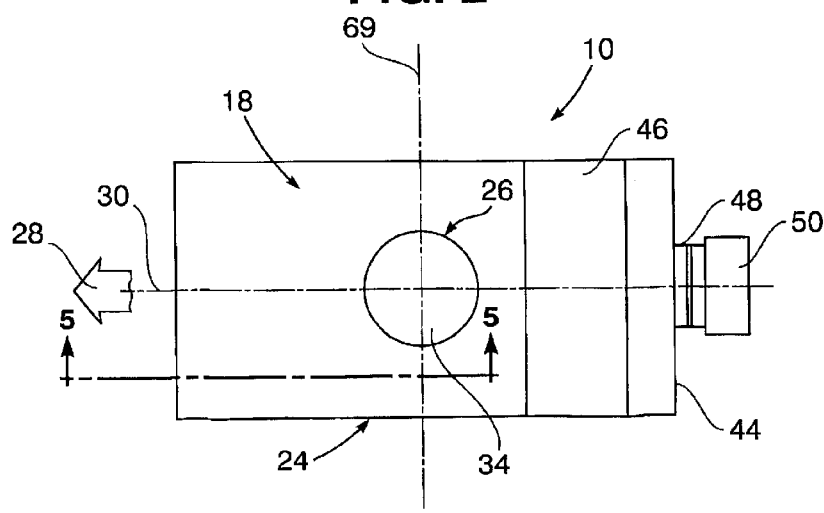
FIG. 2 is a top plan view of the actuator shown in FIG. 1.
Figure 3:
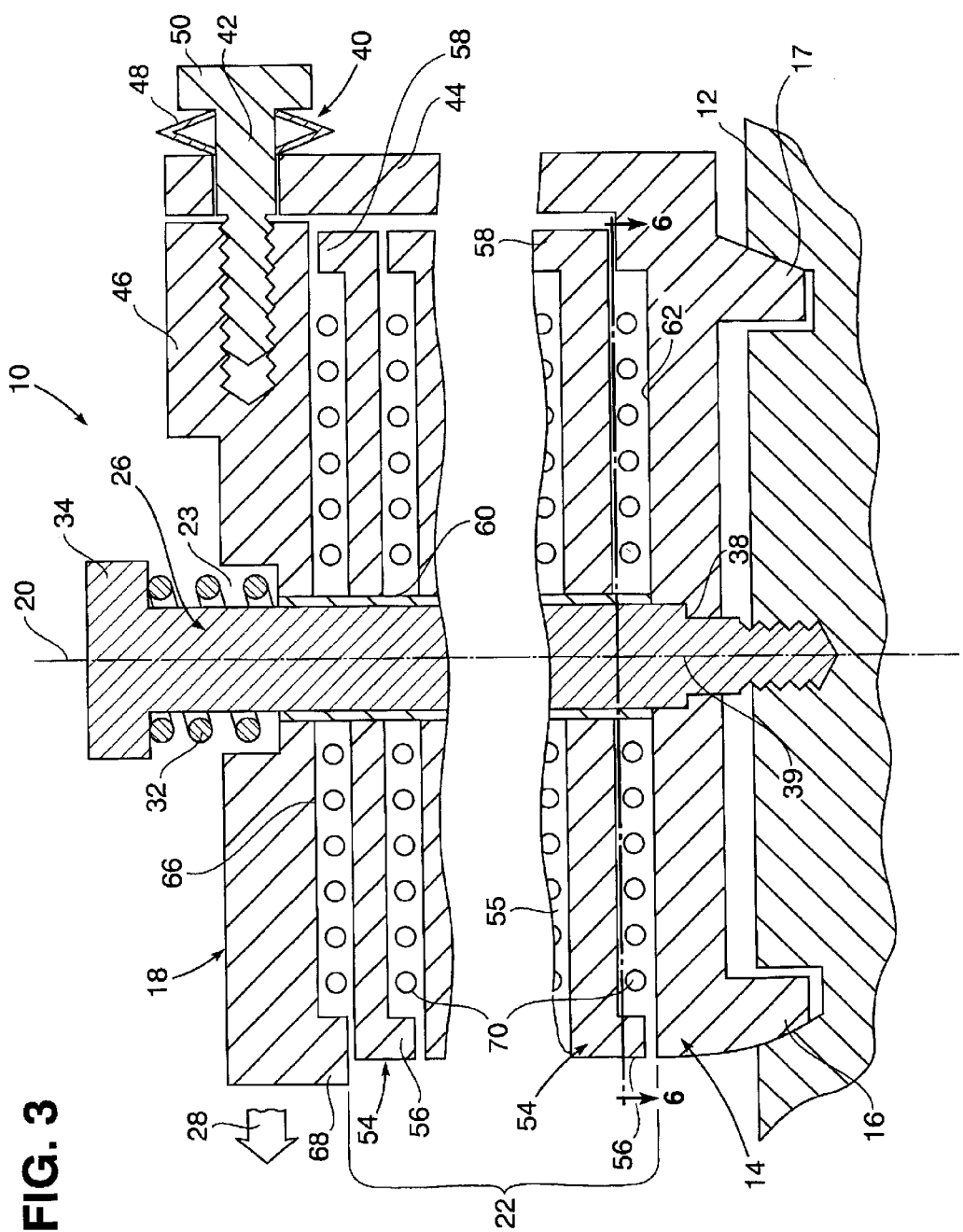
FIG. 3 is a side section view of the actuator taken substantially through a plane indicated by section line 3—3 in FIG. 1.

Referring now to the drawing in detail, FIGS. 1, 2 and 3 illustrate an assembled magnetostrictive actuator, generally referred to by reference numeral 10, fixedly supported on some suitable ground surface 12. A ground plate 14 forming the bottom end of the actuator 10 has spaced tapered legs 16 and 17 projecting therefrom for reception within spaced insert openings 19 formed within the support surface 12 to firmly position the actuator 10 thereon. A top plate 18 of the actuator 10 is vertically spaced above the ground plate 14 in alignment with a prestress bias axis 20. A magnetic circuit assembly generally referred to by reference numeral 22 is clamped between the ground and top plates 14 and 18, under a prestress bias along the axis 20 exerted by a prestress mechanism, which includes a bolt 26 having a coil spring 32 located thereon in alignment with the axis 20 between the bolt head 34 and a recess 23 formed in the top plate 18. The bolt 26 extends through the magnetic assembly 22 into an opening 38 in the bottom plate 14, within which the bolt 26 is seated and from which a threaded end portion 49 of the bolt 26 extends for threaded reception within the ground plate 14 to an adjusted extent by angular displacement of the bolt head 34. When the actuator 10 is so assembled, it is rendered operative to impart a linear motion to the top plate 18 along an output stroke 28 as denoted in FIG. 2, in the direction of axis 30 perpendicular to the bias axis 20. Such output stroke motion of the top plate 18 is resisted by an adjustable tension device 40 which includes a threaded bolt 42 extending through an upper end portion of an end plate 44 attached to one side of the ground plate 14 as shown in FIG. 3, in close forwardly spaced relation to the magnetic circuit assembly 22. The bolt 42 is threadedly received within an enlarged portion 46 of the top plate 18, and a V-shaped spring 48 is disposed on the bolt 42 between its head portion 50 and the end plate 44. Electrical input power is applied, as hereinafter described, to the magnetic circuit assembly 22 in order to generate magnetic fields producing magnetostrictive induced output motion of the top plate 18 in the direction of axis 30 against the adjusted resistance of spring 48 of the tension device 40.

Figure 4:
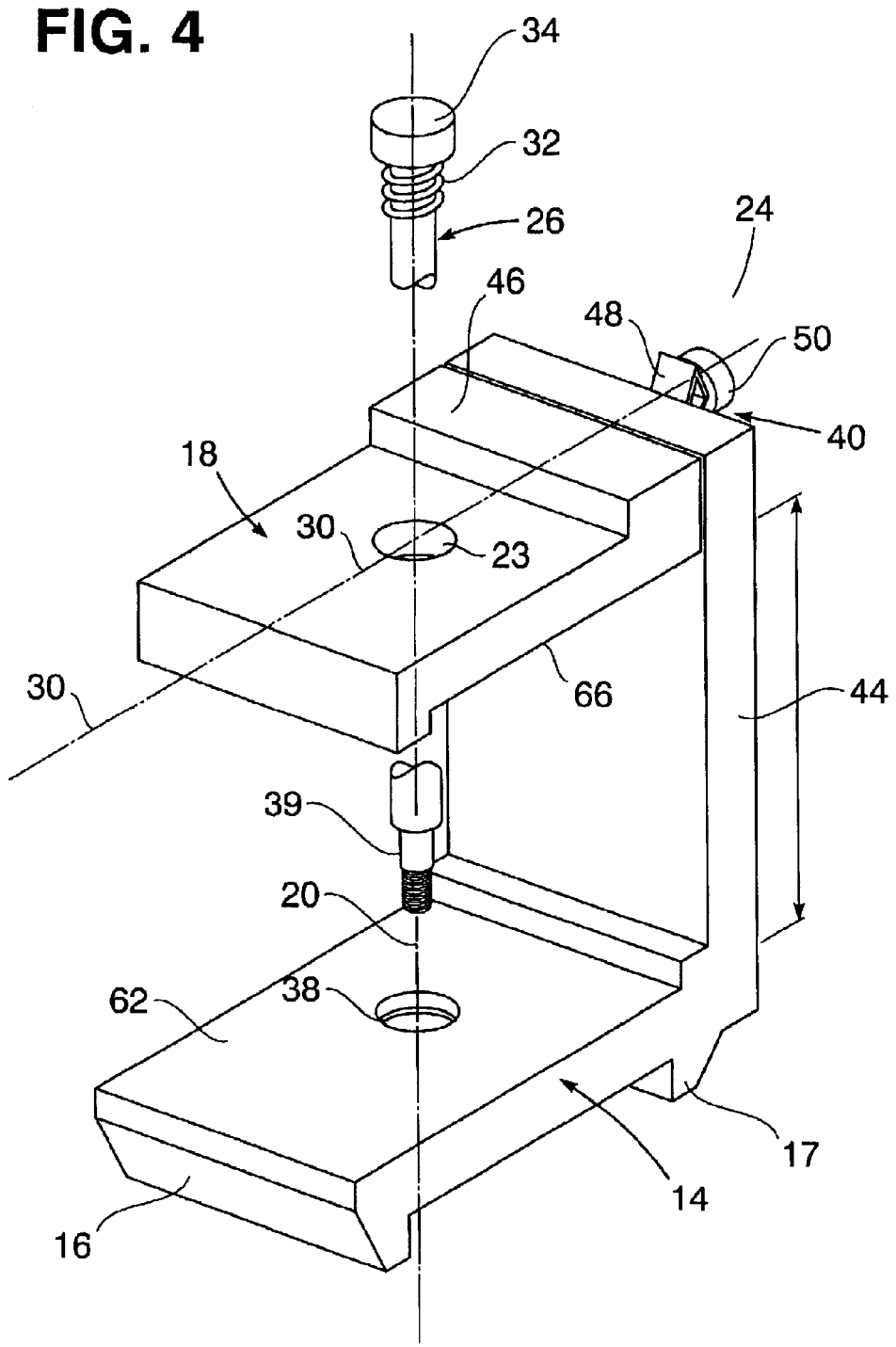
FIG. 4 is a perspective view of disassembled portions of the actuator shown in FIGS. 1, 2 and 3.
Figure 5:
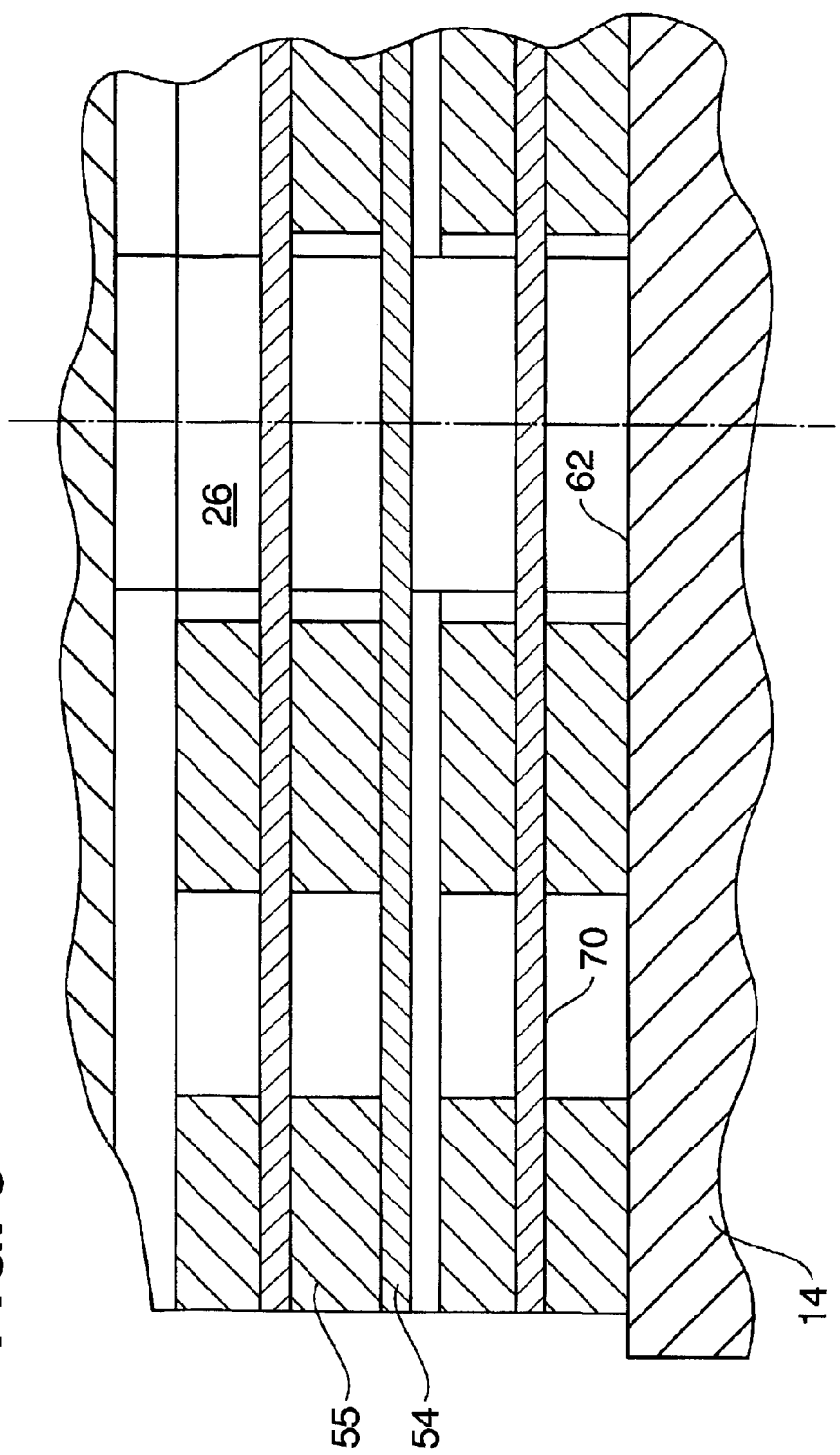
FIG. 5 is a partial section view taken substantially through a plane indicated by section line 5—5 in FIG. 2.
Figure 6:
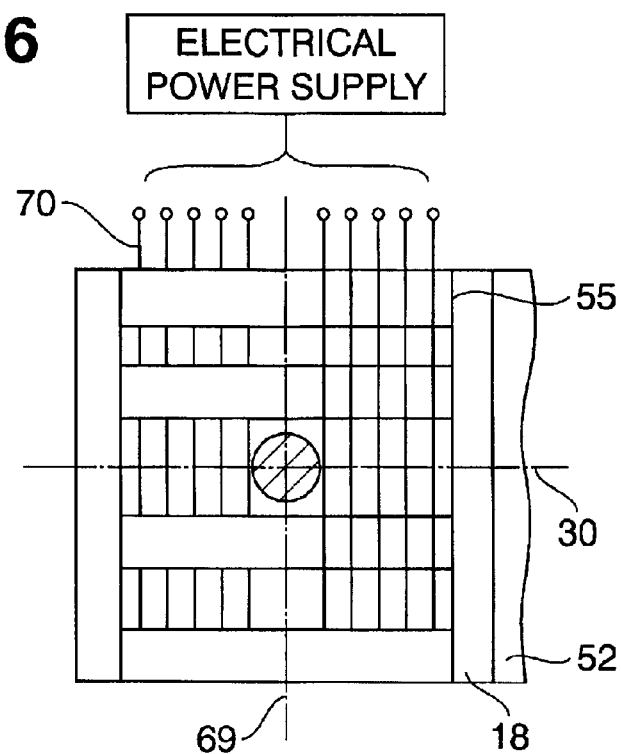
FIG. 6 is a partial section view taken substantially through a plane indicated by section line 6—6 in FIG. 3.

By reference to FIG. 4, assembly of the actuator 10 as shown in FIGS. 1, 2 and 3 under the prestress of the spring 32 exerted through the bolt 26 will become apparent. Thus, the bolt 26 extends from its bead 34 through the recess hole 23 in the top plate 18 to the ground plate 14 having an opening 38 therein, within which the lower end portion 40 of the bolt 26 is seated, and from which the bolt 26 extends into the ground 12. The top and ground plates 18 and 14, which are generally rectangular in shape in the embodiment illustrated in FIGS. 1, 2, 3 and 4, include side portions extending forwardly along the axis 30 from the upwardly extending side plate 44 on the ground plate 14. The adjustable tension device 40 is attached to the enlarged portion 46 of the top plate 14, as shown in FIG. 4, to yieldably resist lateral displacement of the top plate 18 by the magnetic assembly 22 along the axis 30 of the stroke 28 as shown in FIGS. 2 and 3.

As hereinafter explained, magnetostriction action of the magnetic fields in the magnetic circuit assembly 22 is converted into displacement of the top plate 18 in the direction of the stroke axis 30 against the spring bias of the device 40 and under the axial bias of the bolt 26 exerted through the coil spring 32. Such lateral motion of the top plate 18 is thus accommodated while the axial bias is applied thereto by the bolt 26.

Figure 7:
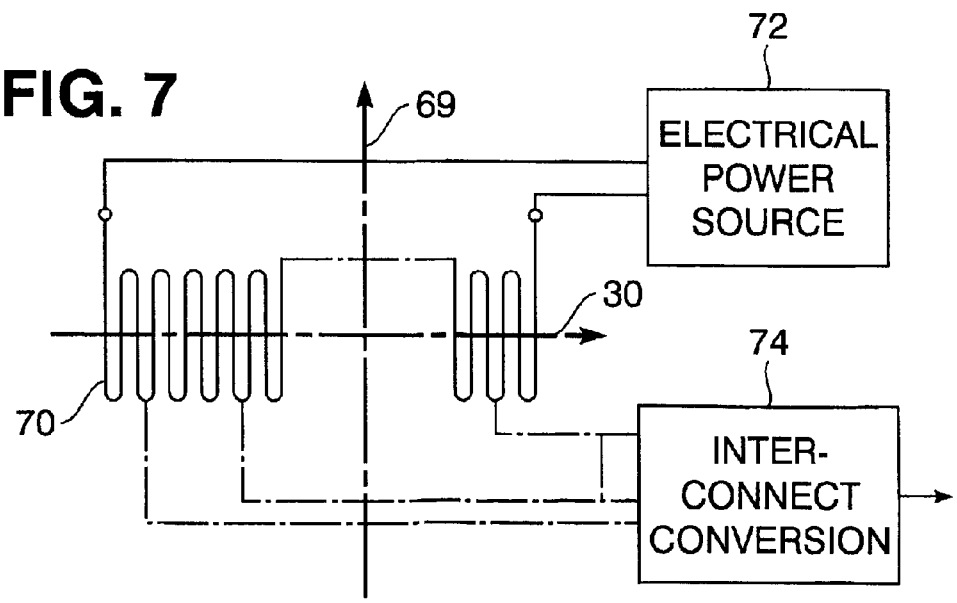
FIG. 7 is a simplified diagram corresponding to the magnetic circuit assembly shown in FIGS. 1–3, 5 and 6.

Referring now to FIGS. 1, 3, 5 and 6, the magnetic circuit assembly 22 consists of a plurality (n) of magnetostrictive layer components, each layer component having a generally rectangular interconnector 54 on which longitudinally elongated magnetostrictive material slabs 55 are positioned on vertically opposite sides thereof. Each interconnector 54 has end retainer projections 56 and 58 respectively extending vertically downwardly and upwardly at the opposite sides of the magnetic circuit assembly 22 for retention of the magnetostrictive slabs 55 therebetween in spaced relation to each other on the flat intermediate portions of the interconnectors 54. Central openings 60 are respectively formed in the interconnectors 54 as shown in FIG. 3 through which the bolt 26 extends through the spaced magnetostrictive slabs 55 to hold assembly 22 in alignment with axis 20. The magnetostrictive slabs 55 positioned on the underside of the lowermost interconnector 54 of the assembly 22 project into contact with a flat top surface 62 of the bottom ground plate 14 between the vertical end plate 44 extending therefrom and the downward projection 56 from the lowermost interconnector 54. The magnetostrictive slabs 55 positioned on the top side of the uppermost interconnector 54 of assembly 22, on the other hand, project into contact with a flat undersurface 66 of the top plate 18 between the downward projection 68 from the top plate 18 and the upward projection 58 on the uppermost interconnector 54, as shown in FIG. 3. Thus, maximum magnetostriction in the direction of an axis 69 as shown in FIG. 2 is induced in the slabs 55 by magnetic fields resulting from electric current conducted through field coils 70 extending through such slabs 55 as diagrammed in FIGS. 6 and 7. A finite amount of magnetostriction is thereby also induced in the direction of axis 30 perpendicular to the axis 69, to exert forces which push against the end retainer projections 56 and 58 on the interconnectors 54. Such magnetostriction at the ground plate 14 pushes against the lowermost interconnector 54 through its end projection 56 at the forward side of the ground plate 14 to initially exert a force on the lowermost interconnector 54 transferred by its other end projection 58 at the rear side thereof to the interconnector 54 of the next layer component thereabove in the assembly 22, within which the energized magnetic field also induces a mechanical motion push in the same lateral direction of axis 30 added to that transferred thereto so as to double the motion output. Such addition of transfer forces is continued in sequence through each of the layer components of assembly 22 until a total of "n" times the initially induced lateral motion push is obtained at the upper end of assembly 22 and applied to the top plate 18 to produce the output motion in response to electrical current supplied to the magnetic field generating coils 70 during each power cycle by electrical power from source 72 as diagrammed in FIG. 7. Upon completion of a power cycle causing substantial lateral movement of the top plate 18 through its operational stroke, the system is returned to its initial state and remains thereat if the electrical power is removed.

It will be apparent from the foregoing description that substantial motion displacement is cyclically imparted to the top plate 18 of the actuator 10 by the slabs 55 in response to magnetic fields produced in sequence by a plurality series connected wiring coils 70 connected to the power source 72 and extending through the slabs 55 made of Terfenol for example. Magnetostriction deformation of the slabs 55 in the crystallographic direction of axis 69, is converted into substantial output stroke motion of the top plate 18 in perpendicular direction of axis 30 by interconnect conversion 74 as diagrammed in FIG. 7. Conversion is established by the layered arrangement of interconnectors 54 as hereinbefore described. Such motion imparted to the top plate 18 by the assembly 22 was maximized by the S-shaped cross-sectional configuration of the interconnectors 54 therein having their oppositely extending projections 56 and 58 at the forward and rear sides through which magnetostriction induced forces between layer components of the assembly 22 are transferred. Such output stroke motion in the direction of axis 30 to an adjusted maximized extent was achieved under the prestress exerted through the bolt 26 in the direction of axis 20, and the adjusted lateral tension applied to the top plate 18 by the device 40.

As an alternative to use of the plurality of wiring coils 70 within the magnetic circuit assembly 22 as hereinbefore described, a single electric coil operatively positioned in surrounding relation to such magnetic circuit assembly may be utilized to perform the same function.

Obviously, other modifications and variations of the present invention may be possible in light of the foregoing teachings. It is therefore to be understood that within the scope of the appended claims the invention may be practiced otherwise than as specifically described.

What is claimed is:

1. In combination with an actuator within which maximized magnetostriction deformation is induced by a magnetic field assembly crystallographically applying magnetic fields in a predetermined direction; the improvement residing in: an output member; means for transferring force produced by said applied magnetic fields in a direction perpendicular to said predetermined direction; and means for converting said transferred force into a substantially enlarged linear output motion of the output member.

2. The combination as defined in claim 1, including a plate member to which said output motion is imparted; and a plurality of magnetostictive material slabs within which said magnetostrictive deformation is induced.

3. The improvement as defined in claim 1, including means for exerting a prestress bias on the force transferring means in a direction perpendicular to both of said directions of the magnetic fields and the output motion.

4. A magnetostrictive actuator, comprising: a ground member; an output member; magnetic circuit means for generating magnetic fields inducing maximized magnetostriction and linear output motion of the output member in one direction perpendicular to the maximized magnetostriction produced by application of the magnetic fields; and prestress means for holding the magnetic circuit means assembled under bias between the ground and the output members.

5. The magnetostrictive actuator as defined in claim 4, wherein said bias of the prestress means is exerted in a direction perpendicular to both the maximized magnetostriction and the output motion.

6. A magnetostrictive motor comprising: an output member to which linear output motion is imported; a plurality of magnetostrictive material slabs to which magnetostrictive forces are applied by magnetic fields; and means for converting the magnetostrictive forces sequentially inducing deformation of the slabs into said linear output motion imparted to the output member.

* * * * *